US011627655B2

(12) United States Patent
Amer et al.

(10) Patent No.: US 11,627,655 B2
(45) Date of Patent: Apr. 11, 2023

(54) ELECTRIC CIRCUIT SYSTEM AND ASSEMBLING METHOD THEREOF

(71) Applicant: ELTEK AS, Drammen (NO)

(72) Inventors: Christine Amer, Drammen (NO); Erik Myhre, Drammen (NO); Håkon Hafnor, Drammen (NO); Jan Tore Brastad, Drammen (NO); Kjetil Hagen, Drammen (NO)

(73) Assignee: ELTEK AS, Drammen (NO)

( * ) Notice: Subject to any disclaimer, the term of this patent is extended or adjusted under 35 U.S.C. 154(b) by 92 days.

(21) Appl. No.: 17/364,728

(22) Filed: Jun. 30, 2021

(65) Prior Publication Data

US 2022/0022312 A1 Jan. 20, 2022

(30) Foreign Application Priority Data

Jul. 3, 2020 (EP) .................................. 20183921

(51) Int. Cl.
*H05K 5/00* (2006.01)
*H05K 1/02* (2006.01)
*H05K 7/20* (2006.01)

(52) U.S. Cl.
CPC ......... *H05K 1/0207* (2013.01); *H05K 1/0209* (2013.01); *H05K 5/0026* (2013.01); *H05K 7/2039* (2013.01)

(58) Field of Classification Search
CPC ....... H05K 5/0026; H05K 1/207; H05K 1/209
See application file for complete search history.

(56) References Cited

U.S. PATENT DOCUMENTS

| 5,272,599 | A | * | 12/1993 | Koenen | .............. | H05K 7/20445 |
| | | | | | | 174/16.3 |
| 9,398,726 | B2 | | 7/2016 | You | | |
| 9,414,480 | B2 | | 8/2016 | Lu | | |
| 9,655,288 | B2 | | 5/2017 | You | | |
| 9,661,786 | B2 | | 5/2017 | Lu | | |
| 9,668,384 | B2 | | 5/2017 | You | | |
| 10,660,243 | B2 | | 5/2020 | You | | |
| 2008/0304238 | A1 | | 12/2008 | Chien | | |
| 2016/0307818 | A1 | | 10/2016 | Kawase | | |

OTHER PUBLICATIONS

EESR of EP201839214.
Internal Search Report by the applicant.

* cited by examiner

*Primary Examiner* — Jeremy C Norris
(74) *Attorney, Agent, or Firm* — J.C. Patents

(57) ABSTRACT

The present disclosure relates to an electric circuit system. The system includes a housing, a printed circuit board mounted within the housing, an electric component conductively mounted to the printed circuit board, and a cooling system for transferring heat away from of the electric component. The printed circuit board is compartmentalizing the inside of the housing into a first compartment and a second compartment, and the electric component is situated in the first compartment. The cooling system includes at least one first heat transferring element located adjacent to the electric component. The at least one first heat transferring element is secured to the housing surrounding the second compartment capable of forming a heat flowing path defined to transfer heat from the electric component to the housing via the at least one first heat transferring element.

17 Claims, 15 Drawing Sheets

Fan

ELECTRIC CIRCUIT SYSTEM AND ASSEMBLING METHOD THEREOF

CROSS-REFERENCE TO RELATED APPLICATION

This application claims priority to European Patent Application No. 20183921.4, filed on Jul. 3, 2020, which is hereby incorporated by reference in its entirety.

TECHNICAL FIELD

The present disclosure relates to an electric circuit system including a cooling system for cooling of an electric component soldered to a printed circuit board. The present disclosure also relates to an assembling method of such an electric circuit system.

BACKGROUND

Outdoor power supply systems are commonly used to supply power to outdoor power consuming systems. One example of such outdoor power consuming systems is telecom equipment, such as telecom base stations. Such a telecom base station is typically supplied with a 48 VDC voltage delivered from a power supply system located adjacent to, or in the proximity of, the base station.

The power supply system may include an alternating current (AC)/direct current (DC) converter for converting an AC voltage from the AC mains (or a fossil-fueled AC generator etc.).

Alternatively, the power supply system may include a DC/DC converter for converting a DC voltage (from a solar panel system, or another type of DC power source).

The power supply system may further include rechargeable batteries to provide UPS (uninterrupted power supply) functionality.

The outdoor power supply system further includes a cabinet in which electrical equipment is protected from the environment. The cabinet provides protection from fine particles (dust, sand etc.) and humidity (rain, snow etc.). FIG. 1 shows one such prior art cabinet, referred to as the Type 4 Outdoor cabinet and described in the datasheet "Outdoor telecom power cabinet (Type 4)" issued by Eltek ASA. This cabinet has an IP code 55 (Ingress Protection code as defined in IEC standard 60529). Power cables, such as AC or DC input power cables and DC output cables, are guided between the inside and outside of the cabinet through its top side or bottom side.

FIG. 2a shows a prior art AC/DC converter module referred to as the Eltek Flatpack 2 SHE converter and described in the brochure "SHE is so cool: Efficiency taken to the next level". There are today two versions, supplying 2000 W and 3000 W respectively. The converter has a power efficiency of about 98%. The electrical and electronic components of the converter module is provided within a cover, as indicated in FIG. 2a. The purpose of the cover is to provide protection against electrical shock and for EMI purposes. One or several such converters may be mounted in a rack within the cabinet shown in FIG. 1.

As the converter and other parts of the power supply system generates heat, a cooling system is needed to cool the air within the cabinet. The cooling system may be a heat exchanger, an air conditioner or a fan-filter. The cooling system has several disadvantages; it reduces the overall power efficiency, it increases the size of the cabinet, it increases the costs of the overall power supply system and it reduces the reliability of the overall system. As shown in FIG. 2a, also the converter itself has a fan on its front side to provide a cooling air flow through the converter.

FIG. 2b shows a prior art AC/DC converter where a power converter module as in FIG. 2a is provided within a metal housing with cooling fins. The housing has an IP65 rating. This AC/DC converter is marketed by Eltek ASA under the name "Chameleon" and is described in the datasheet "Chameleon Standalone 48/650 HE". This converter is passively cooled and hence has a reduced cost due to the lack of an active cooling system. The housing is made of an extruded aluminum alloy, where the printed circuit board (PCB) with all its electrical components is inserted into either the top end opening or the bottom end opening of the housing. The end openings are thereafter closed by a top cover and a bottom cover, the bottom cover including cable connectors for input/output power. This AC/DC converter has an increased manufacturing cost due to the cumbersome assembly procedure.

FIG. 2c shows a prior art AC/DC power system including two converters of FIG. 2b connected together as a power core, the system further including a battery unit. This AC/DC power system is marketed by Eltek ASA and is described in the datasheet "Chameleon PS Systems—Compact-based Power Supply System". It is also vulnerable for theft and vandalism. The system is also limited in how much power it can supply. This system also has an increased manufacturing cost.

The converter module of FIG. 2a typically includes different types of inductor devices with coils of insulated wire wound around a core. The inductor devices may be transformers, inductors, etc. These inductor devices generate heat during operation of the converter module, and this heat must be removed either by active cooling systems or by passively cooling systems.

One object of the present disclosure is to improve cooling of such inductor devices. Another object of the present disclosure is to make it easier to robotize the mounting and soldering process of such inductor devices to the printed circuit board.

SUMMARY

The embodiment of the present disclosure provides an electric circuit system, including:
a housing;
a printed circuit board mounted within the housing;
an electric component conductively mounted to the printed circuit board; and
a cooling system for transferring heat away from of the electric component;
wherein the printed circuit board is compartmentalizing the inside of the housing into a first compartment in which the electric component is situated; and a second compartment;
characterized in that
the cooling system includes at least one first heat transferring element located adjacent to the electric component;
the at least one first heat transferring element is secured to the housing surrounding the second compartment and configured to form a heat flowing path defined to transfer heat from the electric component to the housing via the at least one first heat transferring element.

In one embodiment, the cooling system further includes at least one second heat transferring element provided between the first heat transferring element and the housing surrounding the second compartment, where the heat flowing path is defined to transfer heat from the electric component to the housing via the first heat transferring element and the second heat transferring element.

In one embodiment, the at least one second heat transferring element is provided as part of the housing.

Alternatively, the at least one second heat transferring element is an element separate from the housing, the element being connected between the at least one first heat transferring element and the housing.

In one embodiment, the at least one first or second heat transferring element extend through an opening of the printed circuit board.

Hence, the heat flowing path is defined to transfer heat from the first compartment to the second compartment, i.e. from a first side or the component side of the printed circuit board to a second side or opposite side of the printed circuit board, via an opening in the printed circuit board.

In one embodiment, the opening of the printed circuit board is a circular or oval aperture, an elongated aperture or a notch provided from one of the sides of the printed circuit board.

In one embodiment, the at least one second heat transferring element extend through the opening of the printed circuit board; the cooling system includes a connection system for connecting the first heat transferring element and the second heat transferring element to each other; and the connection system includes a first heat transferring surface provided in one end of the first heat transferring element and a second heat transferring surface provided in one end of the second heat transferring element, the first and second heat transferring surfaces being in contact with each other.

In one embodiment, the system includes an electric insulator provided between the second heat transferring element and the printed circuit board.

In one embodiment, the connection system includes:
a U-shaped edge protruding from the first heat transferring surface and surrounding at least parts of the second heat transferring element.

In one embodiment, the connection system includes:
a notch provided in the second heat transferring surface; and
a notch engaging element protruding from the first heat transferring surface.

In one embodiment, the connection system includes:
a through bore provided through the first heat transferring element;
a fastener receiving bore provided in the second heat transferring element;
a fastener inserted through the through bore and fastened to the fastener receiving bore.

In one embodiment, the first heat transferring element includes a planar heat transferring surface provided adjacent to the housing surrounding the first compartment and is adapted to form a further heat flowing path defined to transfer heat from the electric component to the housing via the at least one first heat transferring element.

In one embodiment, the cooling system includes a thermally conducting material provided between the planar heat transferring surface and the housing surrounding the first compartment.

In one embodiment, the first heat transferring element include a side surface facing the electric component, where the side surface is shaped according to the shape of the electric component.

In one embodiment, one single heat transferring element is located adjacent to two or more electric components.

In one embodiment, two second heat transferring elements are provided between the one single first heat transferring element and the housing.

In one embodiment, a thermally conducting material is provided between the electric component and the first heat transferring element.

In one embodiment, the housing is a protective housing protecting the inside of the housing from an outdoor environment.

In one embodiment, the housing is made of a thermally conducting material.

Accordingly, the housing may be considered to be a part of the cooling system, wherein heat is dissipated from the housing to the environment. In one embodiment, the cooling system includes cooling fins provided on the outer surface of the housing.

In one embodiment, the electric circuit system is a power converter, such as an AC/DC converter, a DC/DC converter and/or an DC/AC converter.

In one embodiment, a distal end of the electric component with respect to the printed circuit board is aligned with a distal end of the first heat transferring element with respect to the printed circuit board.

An embodiment of the present disclosure also provides an assembling method of an electric circuit system, including the steps of:
providing a first heat transferring element and a second heat transferring element;
providing a first housing section and a second housing section, wherein the first and second housing sections together are defining a compartment, wherein the second heat transferring element is protruding into the compartment from the second housing section;
guiding the second heat transferring element through an opening of a printed circuit board, wherein an electric component is conductively mounted to the printed circuit board;
securing the first heat transferring element to the second heat transferring element;
enclosing the compartment by mounting the first housing section to the second housing section.

In one embodiment, the step of securing the first heat transferring element to the second heat transferring element includes the steps of:
inserting a thermally conducting material between the electric component and the second heat transferring element;
placing the first heat transferring element onto the second heat transferring element;
fastening the first heat transferring element to the second heat transferring element by means of a fastener.

BRIEF DESCRIPTION OF THE DRAWINGS

Embodiments of the disclosure will now be described in detail with respect to the enclosed drawings, wherein:

FIG. 9 illustrates a cross sectional view along line A in FIG. 4a;

FIG. 12b is an enlarged view of circle B in FIG. 12a;

DETAILED DESCRIPTION OF THE EMBODIMENTS

Figure 1:
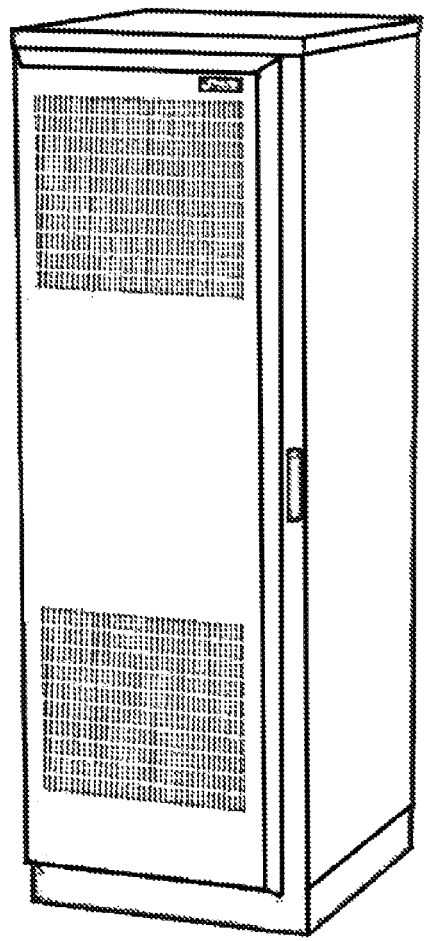
FIG. 1 shows a prior art housing of an outdoor power supply system, the housing being a cabinet.
Figure 2A:
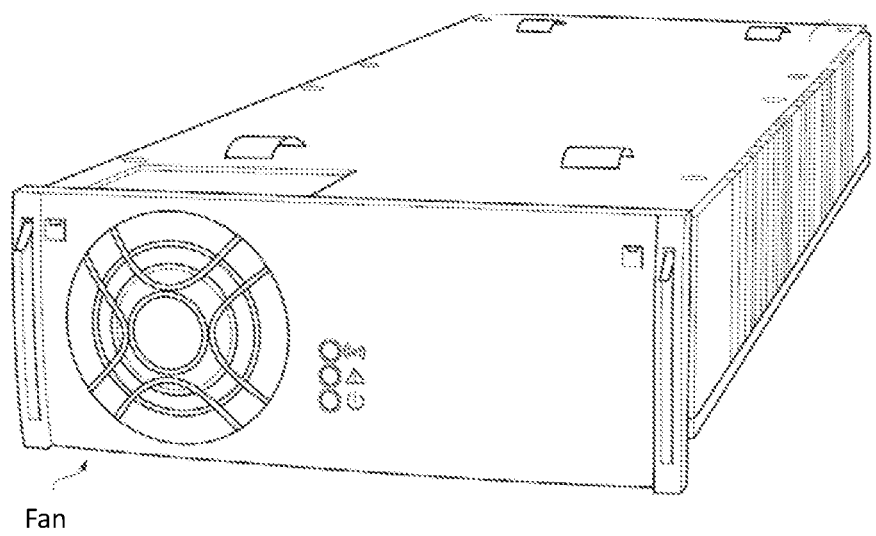
FIG. 2a illustrates a converter module used in the power supply system of FIG. 1.
Figure 2B:
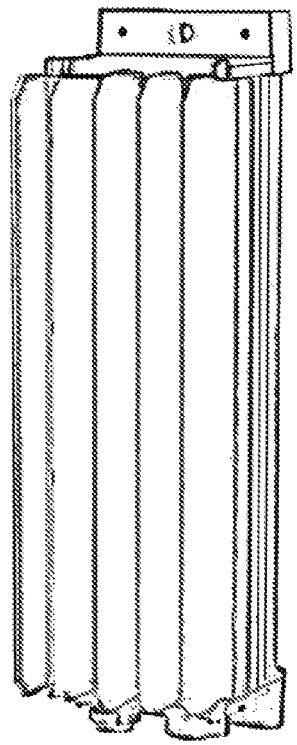
FIG. 2b illustrates a prior art passively cooled converter module.
Figure 2C:
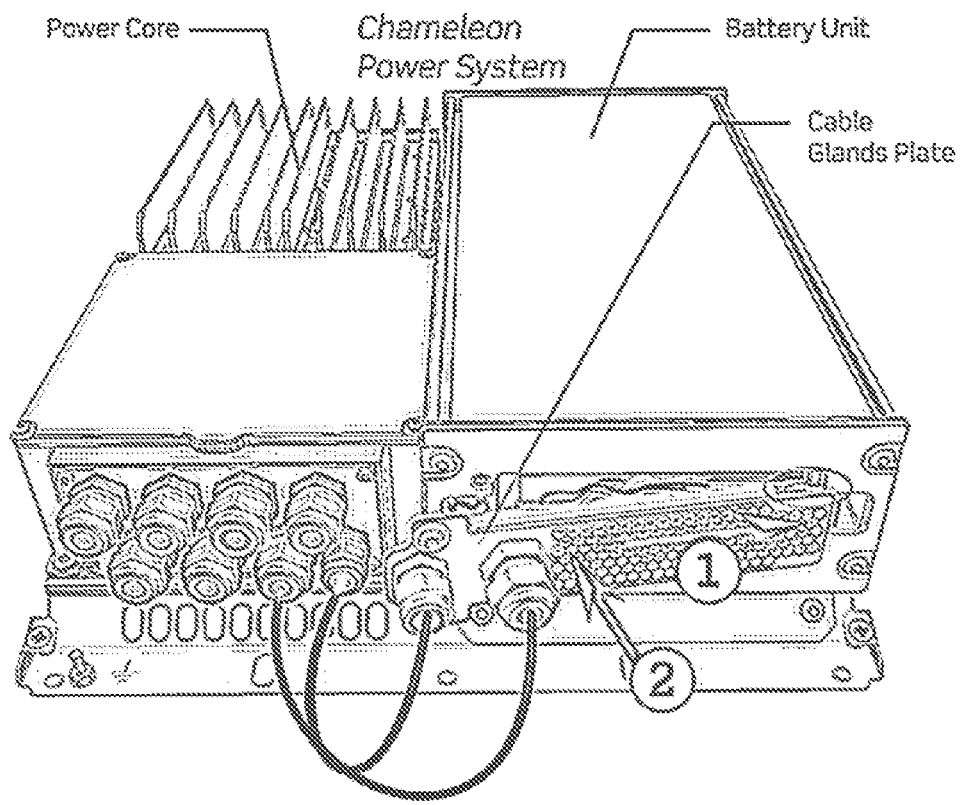
FIG. 2c illustrates a prior art power supply system with two such passively cooled converter modules; illustrates a converter module used in the power supply system of FIG. 1.
Figure 3A:
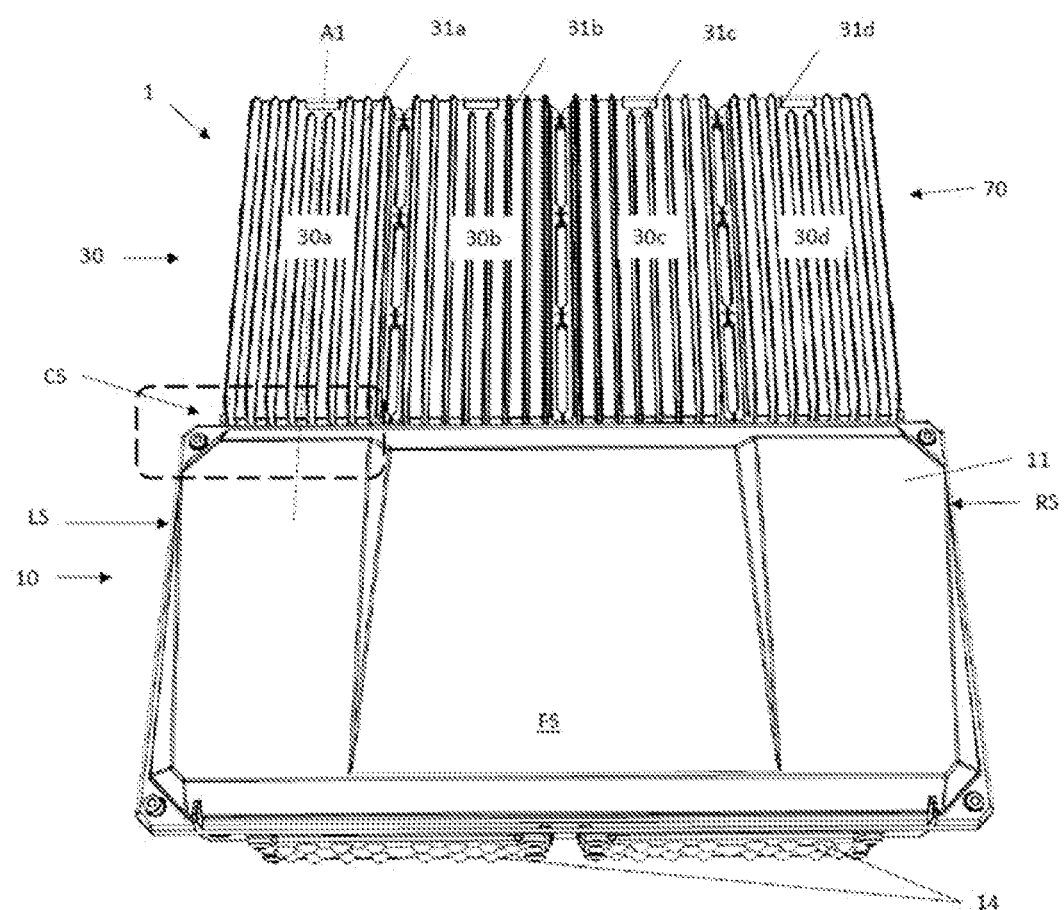
FIG. 3a shows a front view of a first embodiment of an outdoor power supply system.
Figure 3B:
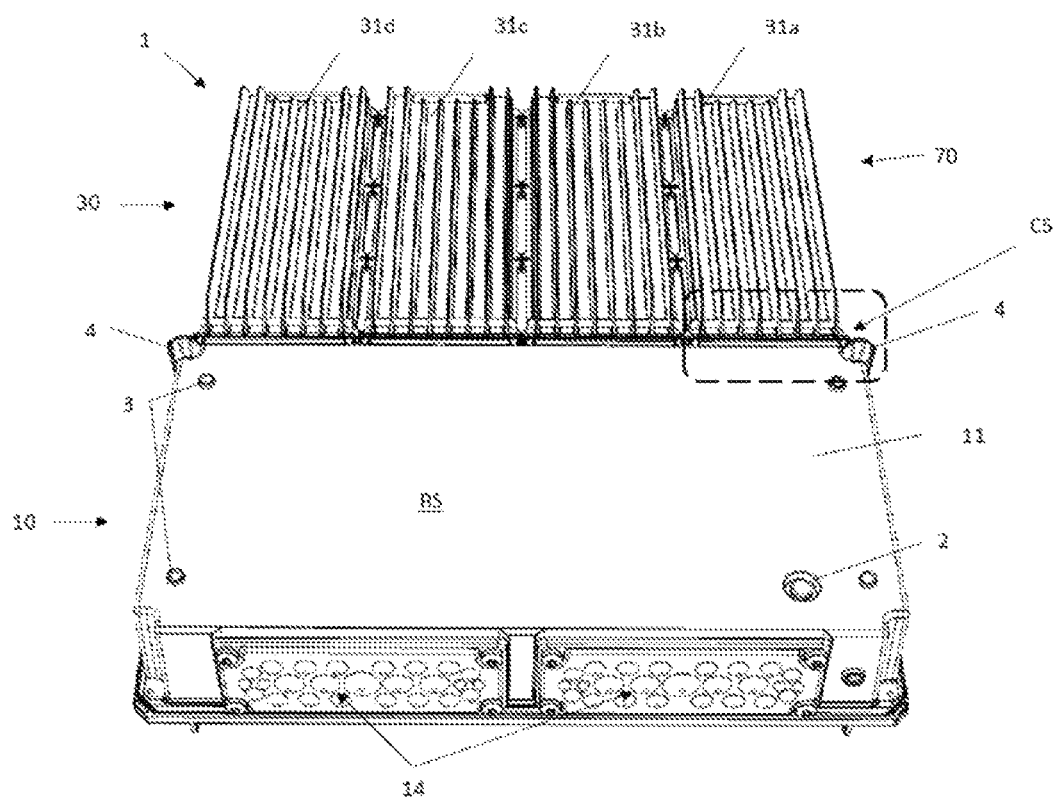
FIG. 3b shows a rear view of the first embodiment.

An introduction of the embodiment of the present disclosure will now be described with reference to FIGS. 3a, 3b, 4a, and 4b. In FIG. 3a and FIG. 3b, the front side FS and rear side RS of a power supply system 1 are shown. The system 1 includes a main unit 10 including a protective main housing 11 and a distribution circuit 20 disposed in the protective main housing 11. The system further includes a converter module unit 30 including a protective module housing 31 and a converter module 40 disposed in the protective module housing 31. In the drawings, the system includes four such converter module units 30a, 30b, 30c, and 30d each including respective module housings 31a, 31b, 31c, 31d and converter modules 40a, 40b. However, the system may include only one, two, three or four such units 30, depending on the expected load connected to the power supply system 1.

The distribution circuit 20 includes cable connectors, circuit breakers/relays, a controller for controlling power through the converter(s) etc., while the converter module 40 includes an AC/DC converter, a DC/DC converter, and/or an DC/AC converter, depending on the input power and load requirement. UPS functionality may also be provided by connecting a rechargeable battery to the distribution circuit 20.

Figure 4A:
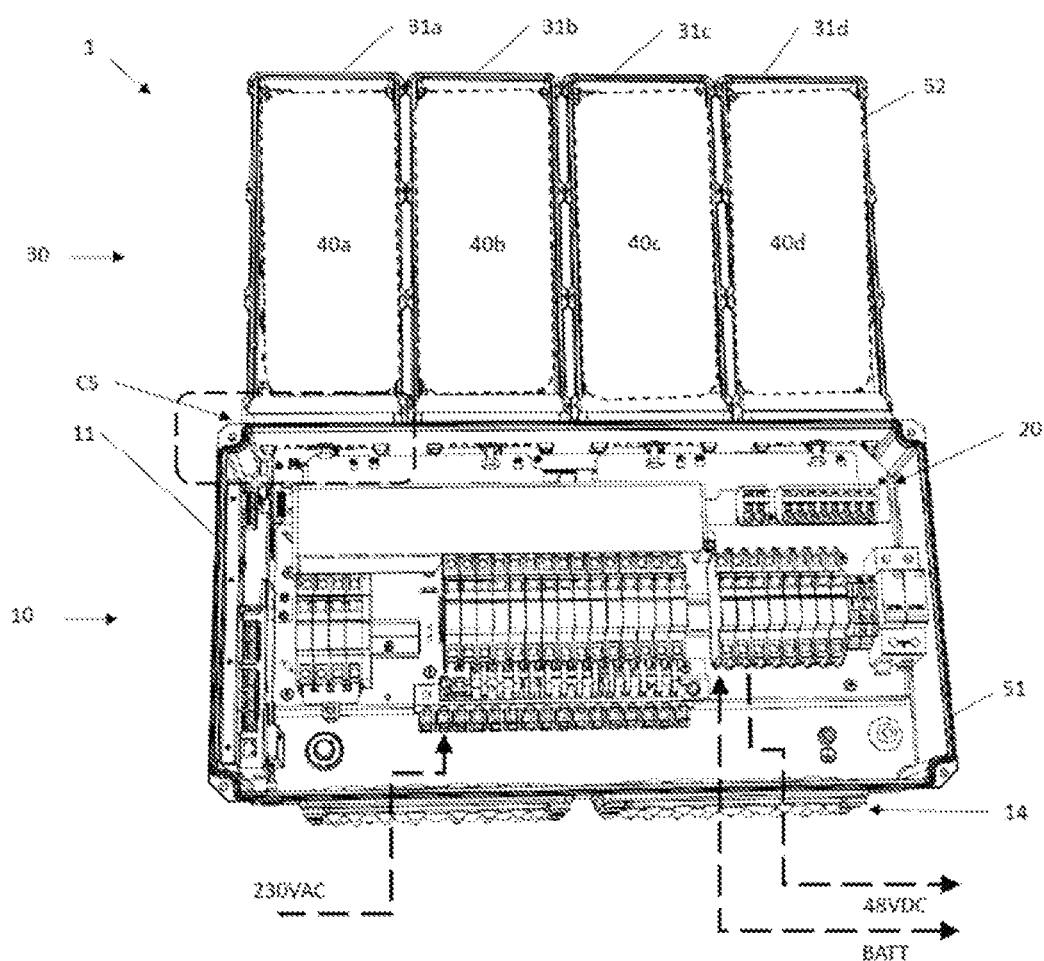
FIG. 4a corresponds to FIG. 3, wherein the upper part of the main housing and the upper part of the respective converter module housings have been removed.
Figure 4B:
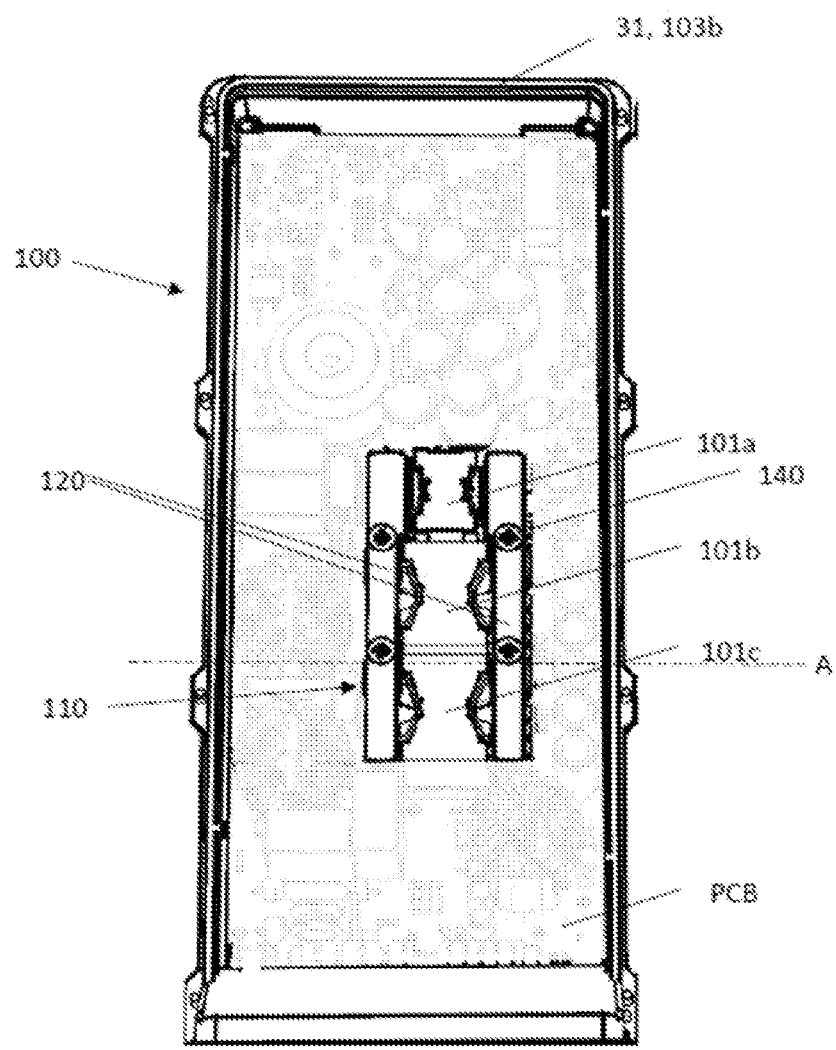
FIG. 4b shown an enlarged view of a converter module located within a converter module housing, where two heat conducting devices are shown.

In FIG. 4b, an electric circuit system 100 is shown. The electric circuit system 100 is here one of the converter modules 40. However, it should be noted that the principles of the present disclosure are not limited to electric power converters.

The electric circuit system 100 will now be described with reference to FIG. 5, which is a simplified cross-sectional view along line A of FIG. 4b.

Figure 5:
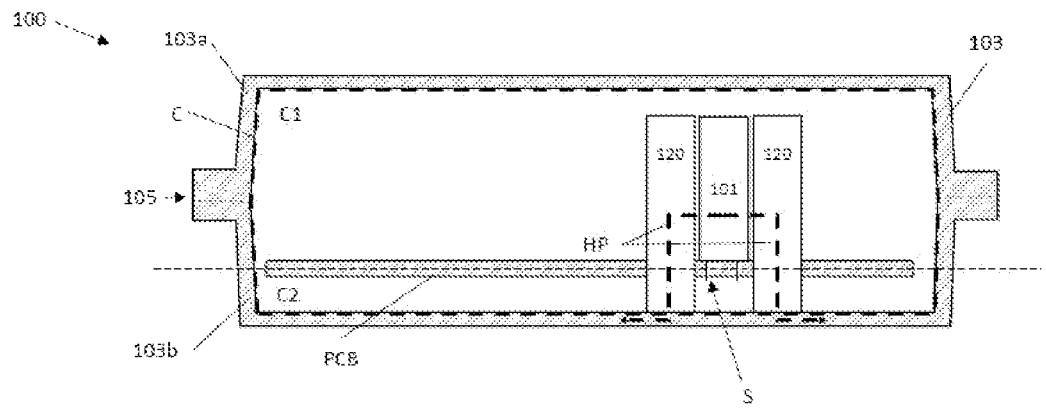
FIG. 5 illustrates a cross sectional view of a first embodiment.

In FIG. 5, it is shown that a housing 103 includes a first housing section 103a and a second housing section 103b connected to each other at an interface 105. A printed circuit board PCB is mounted within the housing 103. A dashed line through the printed circuit board PCB is referred to as a PCB plane.

The housing 103 is defining a compartment indicated with a dashed line C in FIG. 5. The printed circuit board PCB is compartmentalizing the inside of the housing 103 into two sub-compartments of the compartment C: a first compartment C1 and a second compartment C2.

An electric component 101 is shown conductively mounted to the printed circuit board PCB by means of a soldering S. The electric component 101 is provided in the first compartment C1 and the soldering is provided in the second compartment C2. However, the electric component 101 may also be a surface mounted device electrically mounted to the first compartment C1 facing side of the printed circuit board PCB.

When supplied with electric power, the electric component 101 produces heat, which must be removed from the compartment C to prevent overheating.

The system 100 therefore includes a cooling system generally referred to as 110. In an embodiment, the cooling system 110 includes a passive cooling system. The housing 103 may be a part of the cooling system 110, where heat is dissipated from the housing 103 to the environment. The housing 103 is therefore made of a thermally conducting material, such as a metal. In one aspect, the cooling system 110 includes cooling fins 104 provided on the outer surface of the housing 103 (not shown in the simplified illustrations in FIG. 5-8, but shown in FIGS. 9 and 10).

Preferably, the system 100 is designed for outdoor use. In such a case, the housing 103 is a protective housing 103 protecting the inside (i.e. the PCB and the electric component 101) of the housing 103 from an outdoor environment. The system 100 may for example have an IP65 classification.

Preferably, the housing 103 is made of aluminum or an aluminum alloy. The cooling fins of the passive cooling system may be manufactured together with the converter module housing in a die casting process or a machining process.

Different embodiments will now be described further in detail below.

First Embodiment

It is referred to FIG. 5 again. Here, the cooling system 110 includes a first heat transferring element 120 located adjacent to the electric component 101. The first heat transferring element 120 is secured to the housing 103 surrounding the second compartment C2, i.e. the first heat transferring element 120 is secured to the second housing section 103b, and configured to form a heat flowing path HP defined to transfer heat from the electric component 101 to the housing 103 via the at least one first heat transferring element 120.

In this embodiment, the first heat transferring element 120 is secured directly to the second housing section 103b.

Hence, heat generated by the electric component 101 is transferred from the first compartment C1 on one side of the printed circuit board PCB to the second compartment C2 on the opposite side of the printed circuit board PCB and further to the second housing section 103b.

In FIG. 5, and also in FIG. 4b, it is shown that there are two such first heat transferring elements 120, one on each side of the electric component 101 (FIG. 5) or components 101a, 101b, 101c (FIG. 4b).

In FIG. 5, the first heat transferring element 120 is extending through an opening 109 of the printed circuit board PCB. This will be described further in detail below.

Second Embodiment

Figure 6:
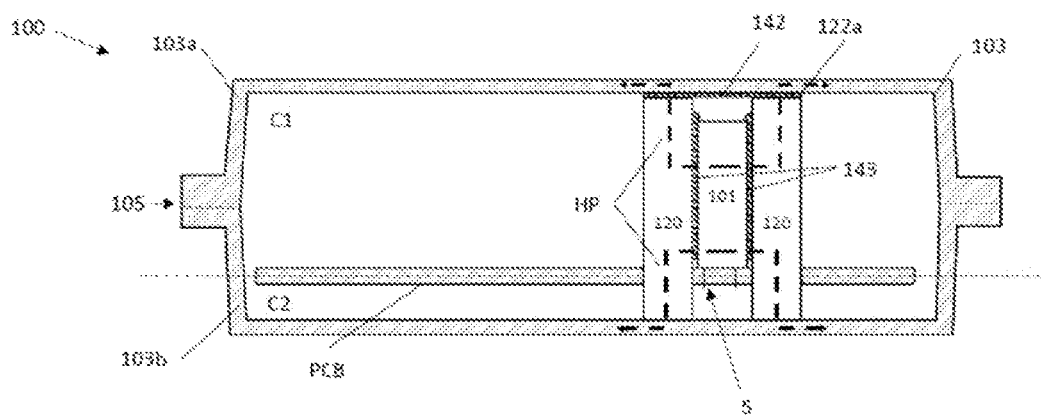
FIG. 6 illustrates a cross sectional view of a second embodiment.

It is now referred to FIG. 6. This embodiment corresponds substantially to the embodiment of FIG. 5, and these corresponding features will not be repeated here. Here, it is shown that the first heat transferring element 120 includes a planar heat transferring surface 122a provided adjacent to the housing 103 surrounding the first compartment C1, i.e. the first housing section 103a, capable of forming a further heat flowing path HP defined to transfer heat from the electric component 101a, 101b, 101c to the housing 103 via the at least one first heat transferring element 120.

Hence, heat generated by the electric component 101 is transferred both to the first and the second housing sections 103a, 103b.

To further improve the heat transfer, the cooling system 110 includes a thermally conducting material 142 provided between the planar heat transferring surface 122a and the housing 103 surrounding the first compartment C1.

Again, to further improve the heat transfer, the cooling system 110 includes a thermally conducting material 143 provided between the electric component 101 and the first heat transferring element 120.

The above thermally conducting material may for example be a thermally conducting pad, a thermally conducting gap filler or a solidified liquid gap filler.

Third Embodiment

Figure 7:
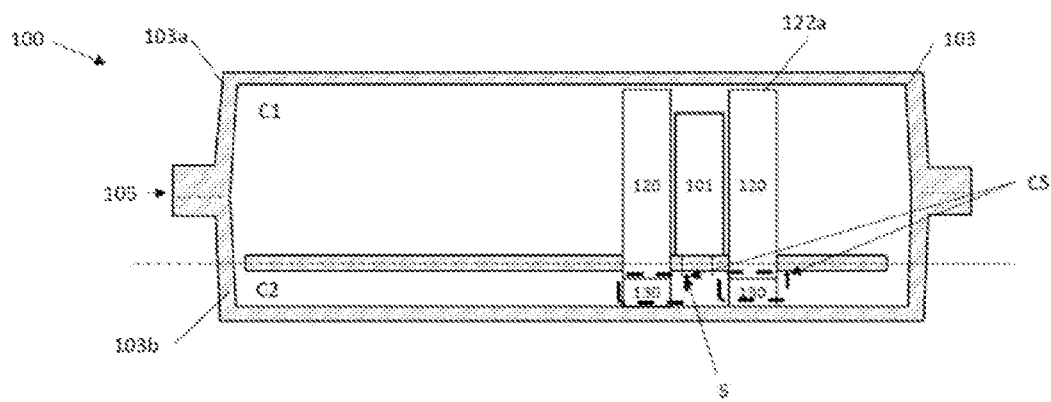
FIG. 7 illustrates a cross sectional view of a third embodiment.

It is now referred to FIG. 7. This embodiment corresponds substantially to the embodiments of FIGS. 5 and 6, and these corresponding features will not be repeated here. In FIG. 7, the thermally conducting material 142, 143 have been removed for the sake of simplicity.

Here, the cooling system 110 further includes a second heat transferring element 130 provided between the first heat transferring element 120 and the housing 103 surrounding the second compartment C2, i.e. the second housing section 103b, where the heat flowing path HP is defined to transfer heat from the electric component 101a, 101b, 101c to the housing 103 via the first heat transferring element 120 and the second heat transferring element 130.

In this embodiment, the second heat transferring element 130 is an element separate from the housing 103, the element being connected between the at least one first heat transferring element 120 and the housing 103.

The cooling system 110 includes a connection system CS for connecting the first heat transferring element 120 and the second heat transferring element 130 to each other. In this embodiment, the connection system CS is located in the second compartment C2.

Fourth Embodiment

Figure 8:
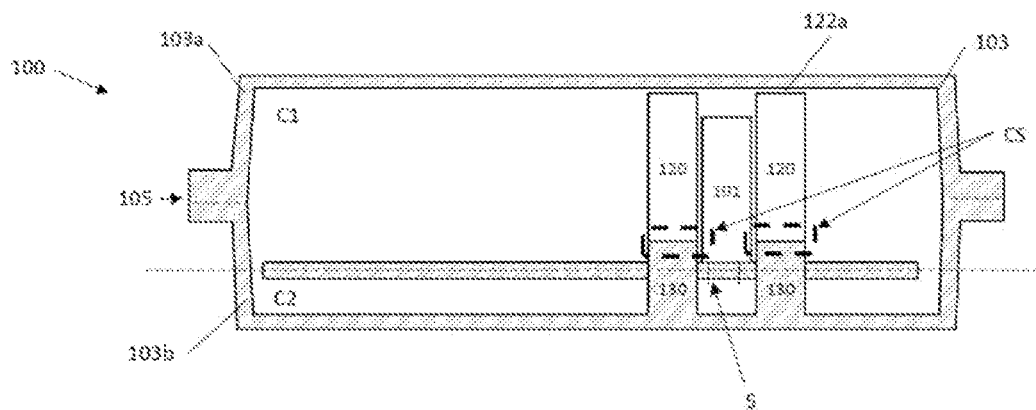
FIG. 8 illustrates a cross sectional view of a fourth embodiment.

It is now referred to FIG. 8. This embodiment corresponds substantially to the embodiment of FIG. 7, and these corresponding features will not be repeated here.

Here, the connection system CS is located in the first compartment C1. This is also the case for the embodiment shown in FIGS. 9 and 10. Hence, it is the second heat transferring element 130 which is extending through an opening 109 of the printed circuit board PCB.

Here, the second heat transferring element 130 is provided as part of the housing 103.

Figure 9:
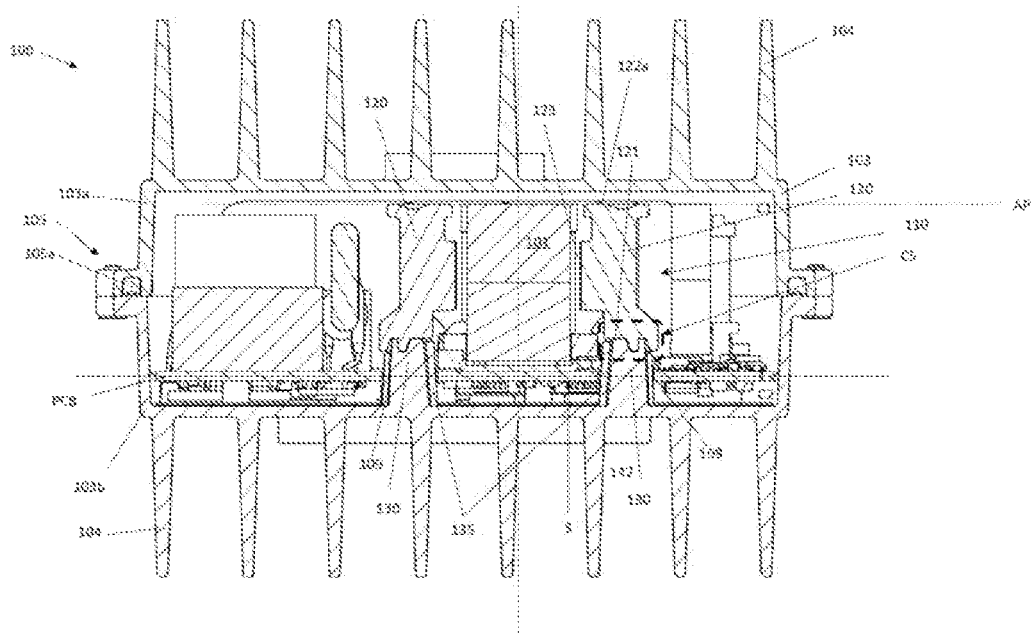

In the embodiment shown in FIG. 9, the electric circuit system 100 further includes an electric insulator 135 provided between the second heat transferring element 130 and the printed circuit board PCB.

Figure 12A:
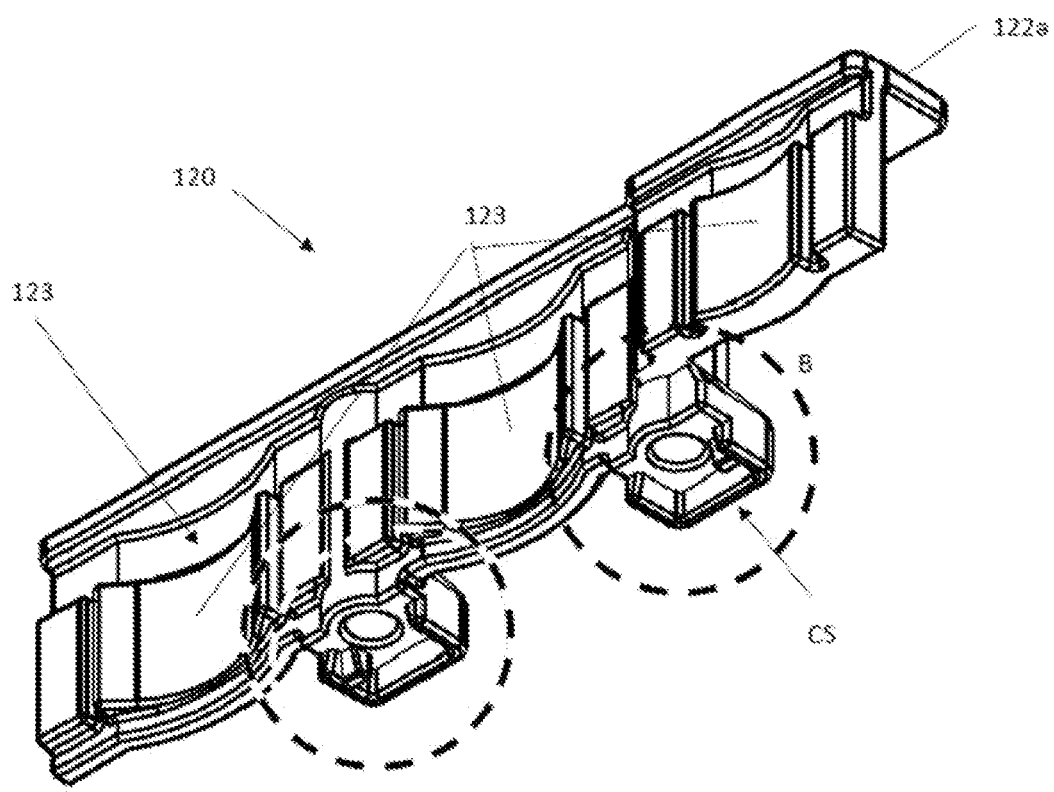
FIG. 12a is a perspective view of a first heat transferring element.
Figure 12B:
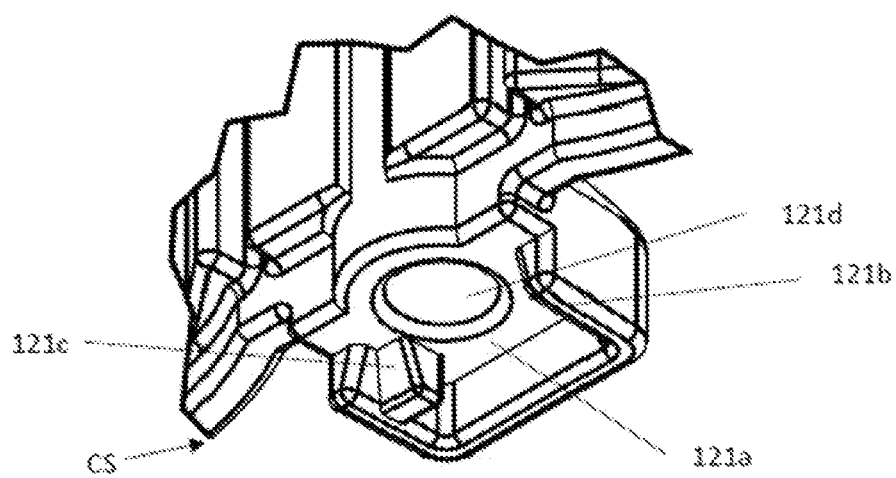
Figure 12C:
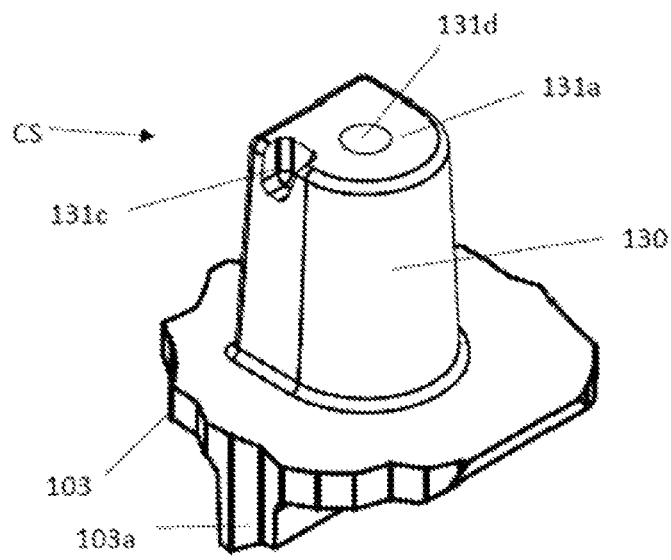
FIG. 12c is an enlarged perspective view of a second heat transferring element.
Figure 13A:
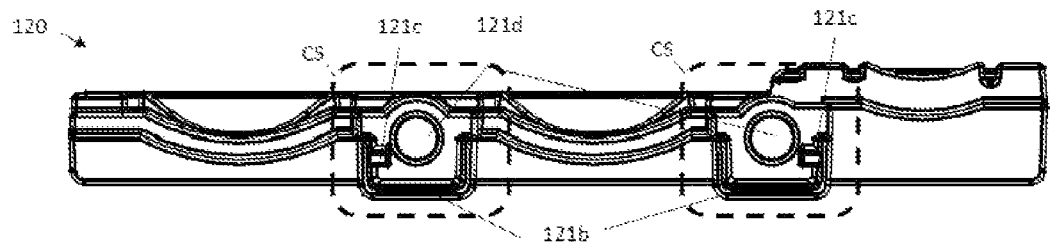
FIG. 13a shows a bottom view of the first heat transferring element (from the PCB side)
Figure 13B:
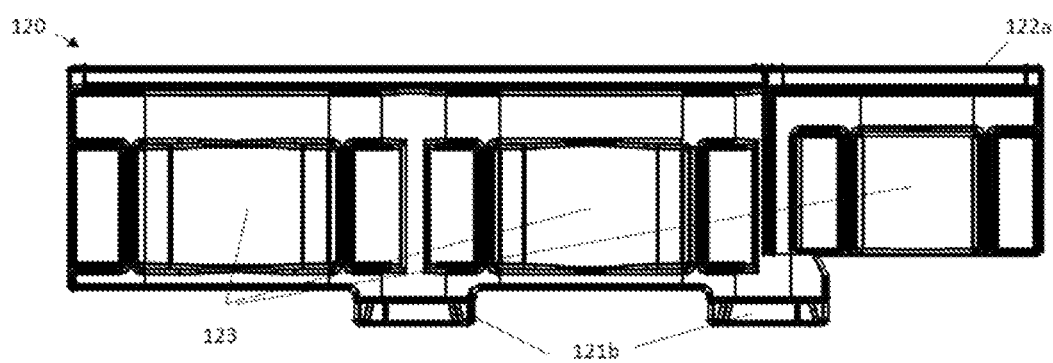
FIG. 13b shows a first side view of the first heat transferring element.
Figure 13C:
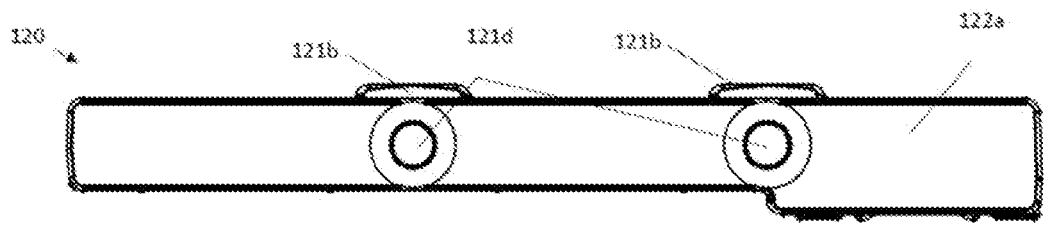
FIG. 13c shows a top view of the first heat transferring element.
Figure 13D:
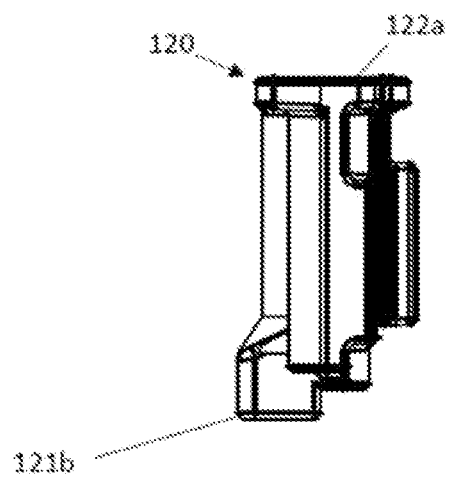
FIG. 13d shows a second side view of the first heat transferring element.

One embodiment of the connection system CS will now be described in detail with reference to FIGS. 12a, 12b, and 12c. First, it should be noted that FIGS. 12b and 12c are not shown in the same scale.

The connection interface CS includes a first heat transferring surface 121a provided in one end of the first heat transferring element 120 and a second heat transferring surface 131a provided in one end of the second heat transferring element 130, the first and second heat transferring surfaces 121a, 131a being in contact with each other when the system 100 is assembled. One purpose of these heat transferring surfaces 121a, 131a is to ensure an efficient heat transfer between the first and second heat transferring elements 120, 130. The heat transferring surfaces are preferably oriented in a plane parallel to the printed circuit board PCB plane.

The connection system CS further includes U-shaped edge 121b protruding from the first heat transferring surface 121a and surrounding at least parts of the second heat transferring element 130 when the system 100 is assembled.

The connection system CS further includes a through bore 121d provided through the first heat transferring element 120 and a fastener receiving bore 131d provided in the second heat transferring element 130. The fastener receiving bore 131d is aligned with the through bore 121d. In addition, the connection system CS includes a fastener 140 (FIG. 4b) inserted through the through bore 121d and fastened to the fastener receiving bore 131d. The fastener 140 may be a screw for fastening to threads provided in the fastener receiving bore 131d. However, other alternate fasteners may also be used.

The connection system CS further includes a notch 131c provided in the second heat transferring surface 131a; and a notch engaging element 121c protruding from the first heat transferring surface 121c. One purpose of the edge 121b and the notch 131c engaging the element 121c is to enable a manufacturing machine to place or set the first heat transferring element 120 onto the second heat transferring element 130 while ensuring that the bores 121d, 131d are aligned correctly to allow the manufacturing machine to insert the fastener and fasten the first heat transferring element 120 to the second heat transferring element 130.

It is now referred to FIG. 12a and FIGS. 13a-d, showing details of the first heat transferring element 120 of FIG. 4b. Here it is shown that one first heat transferring element 120 includes a side surface 123 facing three electric components 101a, 101b, 101c, where the side surface 123 is shaped according to the shape of the electric components 101a, 101b, 101c to improve heat transfer between the electric components and the first heat transferring element 120.

It is also shown here that one first heat transferring element 120 is connected to two second heat transferring elements 130 by means of two connection systems CS. Hence, two fasteners 140 are used to secure the first heat transferring element 120 to the two second heat transferring elements 130.

Figure 11A:
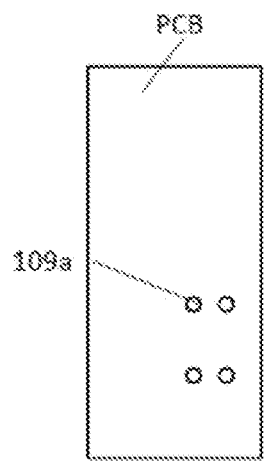
FIGS. 11a and 11b illustrates openings in the printed circuit board.
Figure 11B:
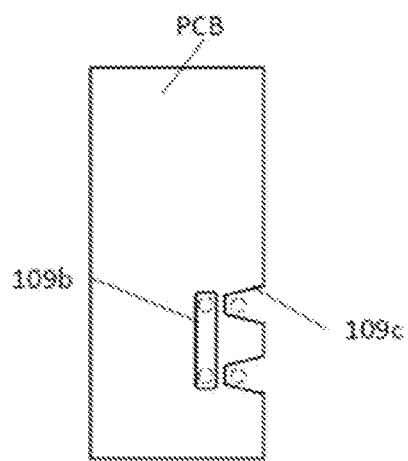

It is now referred to FIGS. 11a and 11b. In FIG. 11a it is shown that the PCB includes four circular or oval openings 109a. Preferably, the openings 109a are adapted to the shape of the second heat transferring element 130. In FIG. 11b it is shown that the opening 109 can include an elongated aperture 109b, i.e. one opening 109 for two or more second heat transferring elements 130. It is also shown that the opening 109 may include a notch 109c provided from one of the sides of the printed circuit board PCB.

Assembly Method

The assembly of the electric circuit system 100 will now be described with reference to FIGS. 14a-14e. The assembly may easily be done by means of a manufacturing robot or a number of manufacturing robots located adjacent to an assembly line.

Initially, the different parts have been manufactured and are located near the assembly site. Hence, the first and second housing sections 103a, 103b are stored or provided near the assembly line together with the first heat transferring element.

Figure 14A:
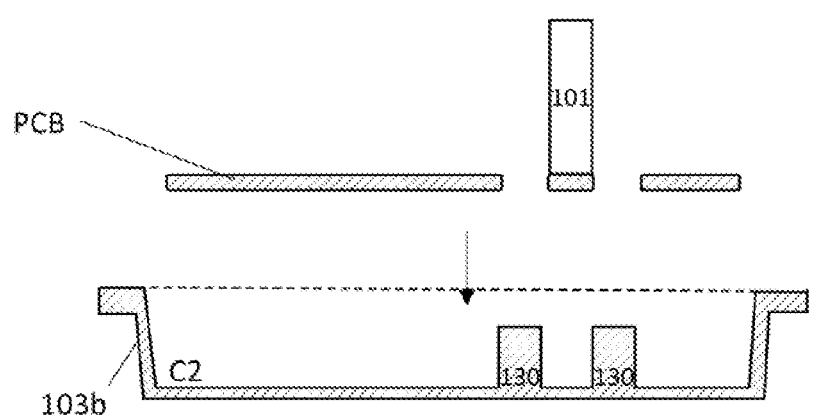
FIGS. 14a-e shows the steps of manufacturing the electric circuit system.

In a first step shown in FIG. 14a, the second housing section 103b is oriented with the opening to the second compartment C2 facing upwards. The second heat transferring element 130 is also protruding upwardly. In this embodiment, the second heat transferring element 130 is provided as part of the second housing section 103b. As shown, there are two such second heat transferring elements 130, for the purpose of transferring heat from both sides of the electric component 101.

The printed circuit board PCB has already been manufactured and electric components are conductively mounted to the printed circuit board PCB. Only one such electric component 101 are shown in FIG. 14a. The printed circuit board PCB are here lowered into the second compartment C2, where the upwardly facing second heat transferring elements 130 are inserted through openings 109 of the printed circuit board PCB and may be used to guide the printed circuit board PCB to its correct position. As shown in FIG. 12c, the second heat transferring element 130 may be at least partially conical for this purpose.

Figure 14B:
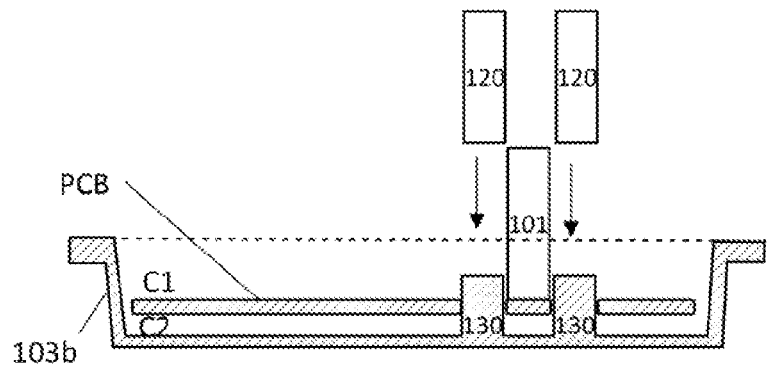

In FIG. 14b, the printed circuit board PCB are in its desired location and the first heat transferring element 120 are lowered towards the second heat transferring elements 130. Due to the connection system CS, the first heat transferring element 120 will not easily fall off the second heat transferring element.

Figure 14C:
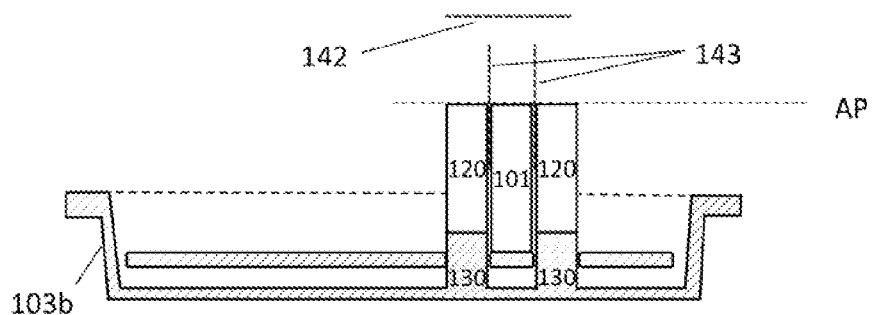

In FIG. 14c, thermally conducting materials 142, 143 are inserted in place. This may preferably take place before the fastener 140 is used to secure the first heat transferring element 120 to the second heat transferring element.

In FIG. 14c, it is also shown that the distal end of the electric component 101 with respect to the printed circuit board (PCB) aligned with the distal end of the first heat transferring elements 120 with respect to the printed circuit board PCB, as indicated by the dashed line indicating an aligning plane AP. Hence, as these distal ends are aligned with respect to the first housing section 103a, it is easy from a manufacturing point of view and efficient from a cooling point of view to provide a heat conducting material in the aligning plane AP to transfer heat from the electric component 101 and the first heat transferring elements 120 to the first housing section 103a. The aligning plane AP is also indicated in FIG. 9.

Figure 14D:
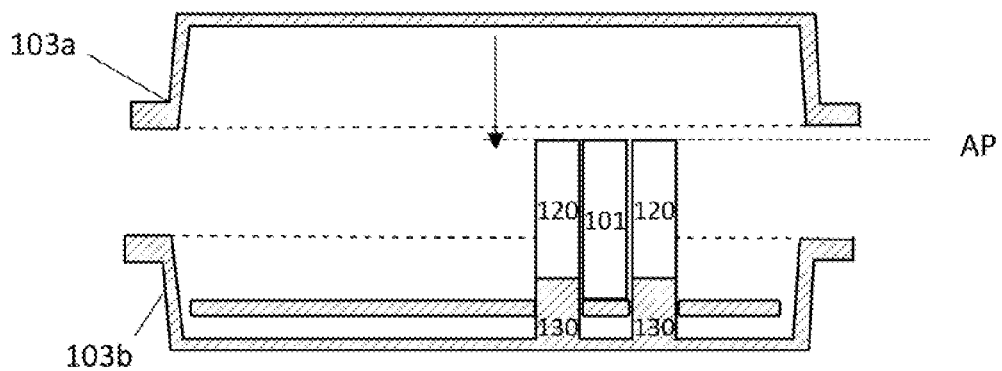

In FIG. 14d, the first housing section 103a is lowered towards the second housing section 103b. A sealing element 105a (FIG. 10) is used to protect the compartment C from the outside of the housing 103.

Figure 10:
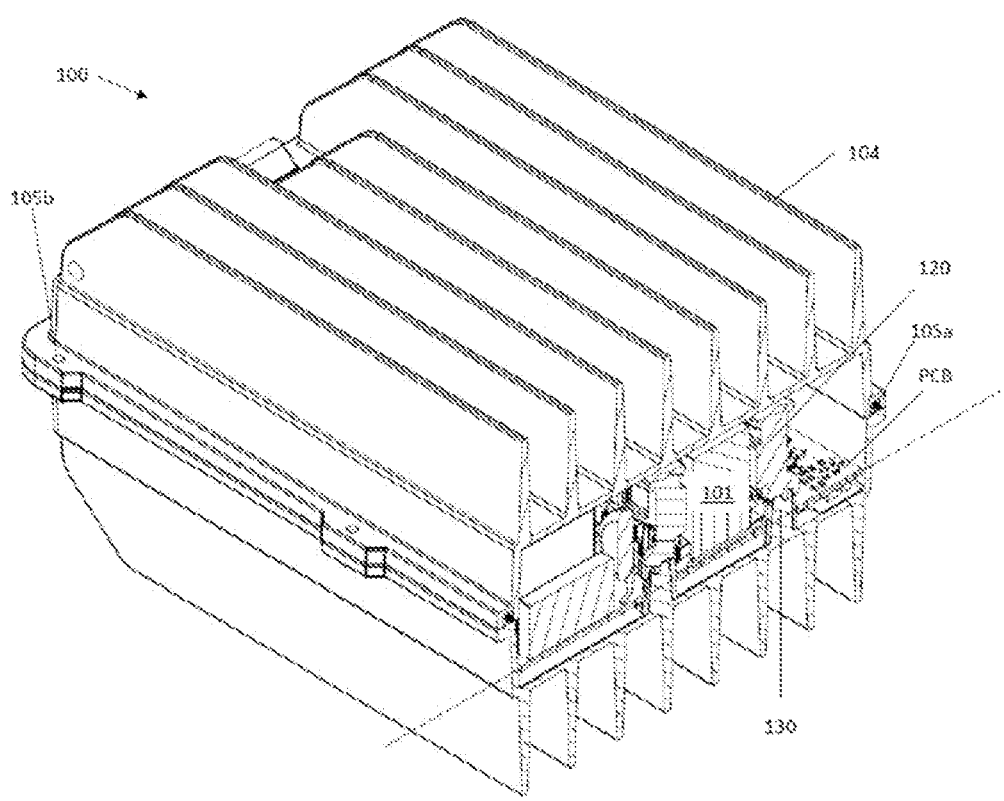
FIG. 10 illustrates a cross sectional perspective view along line A of FIG. 4b.
Figure 14E:
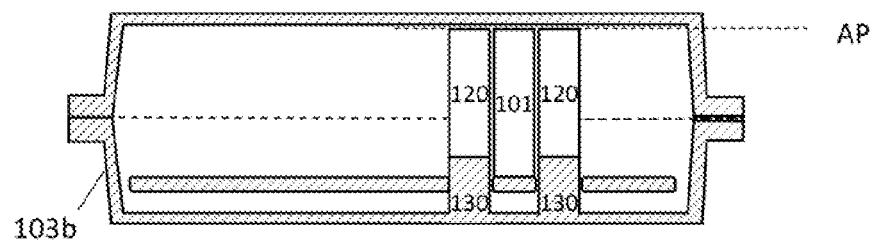

In FIG. 14e, the first housing section 103a is secured to the second housing section 103b for example by means of fasteners inserted in openings 105b (FIG. 10). Hence, the compartment C is now enclosed by the first and second housing sections 103a, 103b.

As many heat generating electric components are located in the first compartment C1, also most of the heat will be generated in the first compartment C1. A printed circuit board PCB is typically not a very good heat conductor. According to the embodiments described above, heat may be transferred efficiently from an electric component on one side of the printed circuit board PCB to the opposite side of the printed circuit board PCB and hence, a more distributed cooling is achieved.

What is claimed is:

1. An electric circuit system (100), comprising:
a housing (103);
a printed circuit board (PCB) mounted within the housing (103);
an electric component (101a, 101b, 101c) conductively mounted to the printed circuit board (PCB); and
a cooling system (110) for transferring heat away from of the electric component (101a, 101b, 101c);
wherein the printed circuit board (PCB) is compartmentalizing the inside of the housing (103) into a first compartment (C1) in which the electric component (101a, 101b, 101c) is situated; and a second compartment (C2);
characterized in that
the cooling system (110) comprises at least one first heat transferring element (120) located adjacent to the electric component (101a, 101b, 101c);
the at least one first heat transferring element (120) is secured to the housing (103) surrounding the second compartment (C2) and configured to form a heat flowing path (HP) defined to transfer heat from the electric component (101a, 101b, 101c) to the housing (103) via the at least one first heat transferring element (120).

2. The electric circuit system (100) according to claim 1, wherein the cooling system (110) further comprises at least one second heat transferring element (130) provided between the first heat transferring element (120) and the housing (103) surrounding the second compartment (C2), where the heat flowing path (HP) is defined to transfer heat from the electric component (101a, 101b, 101c) to the housing (103) via the first heat transferring element (120) and the second heat transferring element (130).

3. The electric circuit system (100) according to claim 2, wherein the at least one second heat transferring element (130) is provided as part of the housing (103).

4. The electric circuit system (100) according to claim 2, wherein two second heat transferring elements (130) are provided between the one single first heat transferring element (120) and the housing (103).

5. The electric circuit system (100) according to claim 2, wherein the housing (103) is a protective housing (103) protecting the inside of the housing (103) from an outdoor environment.

6. The electric circuit system (100) according to claim 1, wherein the at least one first or second heat transferring element (120, 130) extend through an opening (109) of the printed circuit board (PCB).

7. The electric circuit system (100) according to claim 1, wherein:
the at least one second heat transferring element (130) extend through the opening (109) of the printed circuit board (PCB);

the cooling system (110) comprises a connection system (CS) for connecting the first heat transferring element (120) and the second heat transferring element (130) to each other;

the connection system (CS) comprises a first heat transferring surface (121a) provided in one end of the first heat transferring element (120) and a second heat transferring surface (131a) provided in one end of the second heat transferring element (130), the first and second heat transferring surfaces (121a, 131a) being in contact with each other.

8. The electric circuit system (100) according to claim 7, wherein the system (100) comprises an electric insulator (135) provided between the second heat transferring element (130) and the printed circuit board (PCB).

9. The electric circuit system (100) according to claim 7, wherein the connection system (CS) comprises:
   a U-shaped edge (121b) protruding from the first heat transferring surface (121a) and surrounding at least parts of the second heat transferring element (130).

10. The electric circuit system (100) according to claim 7, wherein the connection system (CS) comprises:
    a notch (131c) provided in the second heat transferring surface (131a); and
    a notch engaging element (121c) protruding from the first heat transferring surface (121c).

11. The electric circuit system (100) according to claim 1, wherein the connection system (CS) comprises:
    a through bore (121d) provided through the first heat transferring element (120);
    a fastener receiving bore (131d) provided in the second heat transferring element (130); and
    a fastener (140) inserted through the through bore (121d) and fastened to the fastener receiving bore (131d).

12. The electric circuit system (100) according to claim 1, wherein the first heat transferring element (120) comprises a planar heat transferring surface (122a) provided adjacent to the housing (103) surrounding the first compartment (C1) to form a further heat flowing path (HP) defined to transfer heat from the electric component (101a, 101b, 101c) to the housing (103) via the at least one first heat transferring element (120).

13. The electric circuit system (100) according to claim 1, wherein the first heat transferring element (120) comprise a side surface (123) facing the electric component (101a, 101b, 101c), where the side surface (123) is shaped according to the shape of the electric component (101a, 101b, 101c).

14. The electric circuit system (100) according to claim 1, wherein one single heat transferring element (120) is located adjacent to two or more electric components (101a, 101b, 101c).

15. The electric circuit system (100) according to claim 1, wherein the housing (103) is made of a thermally conducting material.

16. An assembling method of an electric circuit system, comprising the steps of:
    providing a first heat transferring element (120) and a second heat transferring element (130);
    providing a first housing section (103a) and a second housing section (103b), wherein the first and second housing sections (103a, 103b) together are defining a compartment (C), wherein the second heat transferring element (130) is protruding into the compartment (C) from the second housing section (103b);
    guiding the second heat transferring element (130) through an opening (109) of a printed circuit board (PCB), wherein an electric component (101a, 101b, 101c) is conductively mounted to the printed circuit board (PCB);
    securing the first heat transferring element (120) to the second heat transferring element (130); and
    enclosing the compartment (C) by mounting the first housing section (103a) to the second housing section (103b).

17. The method according to claim 16, wherein the step of securing the first heat transferring element (120) to the second heat transferring element (130) comprises the steps of:
    inserting a thermally conducting material (143) between the electric component (101a, 101b, 101c) and the second heat transferring element (130);
    placing the first heat transferring element (120) onto the second heat transferring element (130); and
    fastening the first heat transferring element (120) to the second heat transferring element (130) by means of a fastener (140).

* * * * *